US008994380B2

(12) United States Patent
Yun et al.

(10) Patent No.: US 8,994,380 B2
(45) Date of Patent: Mar. 31, 2015

(54) DISPLAY DEVICE AND METHOD FOR DETECTING LINE DEFECTS OF THE DISPLAY DEVICE

(71) Applicant: LG Display Co., Ltd., Seoul (KR)

(72) Inventors: Soon-Il Yun, Gyeonggi-do (KR); Chang-Ho Oh, Seoul (KR); Young-Hee Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 286 days.

(21) Appl. No.: 13/721,308

(22) Filed: Dec. 20, 2012

(65) Prior Publication Data

US 2014/0084941 A1 Mar. 27, 2014

(30) Foreign Application Priority Data

Sep. 25, 2012 (KR) .................. 10-2012-0106788

(51) Int. Cl.
*G09G 3/00* (2006.01)
*G01R 31/02* (2006.01)
*G09G 3/32* (2006.01)

(52) U.S. Cl.
CPC .............. *G01R 31/021* (2013.01); *G09G 3/006* (2013.01); *G09G 3/3225* (2013.01); *G09G 2300/0426* (2013.01); *G09G 2330/12* (2013.01)
USPC ....................................................... 324/543

(58) Field of Classification Search
USPC ....................................................... 324/543
See application file for complete search history.

(56) References Cited

U.S. PATENT DOCUMENTS

| 5,570,029 | A | * | 10/1996 | Bottman et al. | 324/628 |
| 5,757,193 | A | * | 5/1998 | Yu et al. | 324/501 |
| 6,791,207 | B2 | * | 9/2004 | Yoshida et al. | 307/10.1 |
| 7,053,649 | B1 | | 5/2006 | Osada | |
| 2006/0145996 | A1 | | 7/2006 | Chang | |
| 2009/0231255 | A1 | | 9/2009 | Tanimoto et al. | |
| 2011/0006780 | A1 | | 1/2011 | Tanimoto et al. | |
| 2012/0187954 | A1 | * | 7/2012 | Hsu | 324/537 |
| 2013/0307557 | A1 | * | 11/2013 | Lee et al. | 324/522 |

FOREIGN PATENT DOCUMENTS

EP 0627722 A2 12/1994
KR 10-2006-0080773 A 7/2006

OTHER PUBLICATIONS

Combined Search and Examination Report issued by the GB Patent Office in counterpart GB Patent Application No. 1223057.9 dated Jun. 7, 2013.

(Continued)

*Primary Examiner* — Jeff Natalini
(74) *Attorney, Agent, or Firm* — Morgan, Lewis & Bockius LLP

(57) ABSTRACT

A display device, which can prevent defects in a drive power transmission line and damage which is caused to a common electrode by such defects, and a method for detecting line defects of the display device are provided. The display device includes a plurality of drive power transmission lines for transmitting drive power to pixels, at least one defect detection line that crosses at least one drive power transmission line, and a defect detector for outputting a defect detection signal to the at least one defect detection line, collecting a feedback signal generated from the defect detection line according to the defect detection signal, and determining whether or not there is a defect in the at least one drive power transmission line based on comparison between the defect detection signal and the feedback signal.

30 Claims, 12 Drawing Sheets

(56) References Cited

OTHER PUBLICATIONS

Office Action issued in Korean Patent Application No. 10-2006-00807723 dated Mar. 31, 2014.

Office Action issued by the German Patent Office in counterpart German Patent Application No. 102012113019.1 dated Apr. 12, 2013.

* cited by examiner

DISPLAY DEVICE AND METHOD FOR DETECTING LINE DEFECTS OF THE DISPLAY DEVICE

This application claims the benefit of Korean Patent Application No. 10-2012-0106788, filed on Sep. 25, 2012 which is hereby incorporated by reference as if fully set forth herein.

BACKGROUND OF THE INVENTION

1. Field of the Invention

The present invention relates to a display device, and more particularly, to a display device, which can prevent defects in a drive power transmission line and damage which is caused to a common electrode by such defects, and a method for detecting line defects of the display device.

2. Discussion of the Related Art

A display device, especially, a light emitting diode display device, activates light emitting elements in pixels using drive power from drive power transmission lines. Such drive power is supplied to all pixels through a plurality of drive power transmission lines. However, defects may occur in part of the drive power transmission lines due to foreign substance or other causes. Exemplary defects include an open defect caused by damage and opening of part of the drive power transmission lines and a short-circuit defect caused by short-circuiting between adjacent drive power transmission lines.

If such a defect occurs, current may concentrate into a common electrode to which the drive power transmission lines are commonly connected, which may cause great damage such as burning of the common electrode.

SUMMARY OF THE INVENTION

Accordingly, the present invention is directed to a display device and a method for detecting line defects in the display device that substantially obviate one or more problems due to limitations and disadvantages of the related art.

An object of the present invention is to provide a display device, which can detect a defect of a drive power transmission line in advance through a defect detection line, and a method for detecting line defects of the display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a plurality of drive power transmission lines for transmitting drive power to pixels, at least one defect detection line that crosses at least one drive power transmission line, and a defect detector for outputting a defect detection signal to the at least one defect detection line, collecting a feedback signal generated from the defect detection line according to the defect detection signal, and determining whether or not there is a defect in the at least one drive power transmission line based on comparison between the defect detection signal and the feedback signal.

Preferably, the number of the at least one defect detection line is 1 and the defect detection line crosses all the plurality of drive power transmission lines.

Preferably, the display device further includes a common electrode connected to one end of the at least one drive power transmission line, wherein the defect detection line is located between a pixel region within which the pixels are present and the common electrode.

Preferably, the display device further includes at least one conductive film, wherein the defect detection signal is provided to the defect detection line through the at least one conductive film, and the feedback signal is provided to the defect detector through the at least one conductive film.

Preferably, the at least one conductive film includes 2 or more conductive films, the defect detector outputs the defect detection signal through an output terminal of the defect detector and collects the feedback signal through an input terminal of the defect detector, one end of the defect detection line is connected to the output terminal of the defect detector through one conductive film, and the other end of the defect detection line is connected to the input terminal of the defect detector through another conductive film.

Preferably, the conductive films are arranged along a longitudinal direction of the defect detection line, and conductive films which are located farthest from each other among the conductive films are the one conductive film and the another conductive film, respectively.

Preferably, a data integrated circuit for providing a data signal to the pixels is embedded in at least one of the conductive films, and conductive films in which the data integrated circuit is not embedded are the one conductive film and the another conductive film, respectively.

Preferably, the display device further includes a first connecting line through which the one end of the defect detection line and the one conductive film are connected to each other, and a second connecting line through which the other end of the defect detection line and the another conductive film are connected to each other, wherein the first connecting line and the second connecting line are formed in the same layer and the first connecting line and the defect detection line are formed in different layers.

Preferably, the number of the at least one defect detection line is 2, the 2 defect detection lines are a first defect detection line and a second defect detection line, the first and second defect detection lines cross all the plurality of drive power transmission lines, and the first and second defect detection lines are located at different parts of the plurality of drive power transmission lines.

Preferably, the display device further includes a first common electrode connected to one ends of the drive power transmission lines and a second common electrode connected to the other ends of the drive power transmission lines, wherein a first defect detection line is located between a pixel region within which the pixels are present and the first common electrode and a second defect detection line is located between the pixel region and the second common electrode.

Preferably, the display device further includes at least one conductive film, wherein the defect detection signal is provided to the first and second defect detection lines through the at least one conductive film, a feedback signal from the first defect detection line is provided to the defect detector through the at least one conductive film, and a feedback signal from the second defect detection line is provided to the defect detector through the at least one conductive film.

Preferably, the at least one conductive film includes 2 or more conductive films, the defect detector outputs the defect detection signal through first and second output terminals of the defect detector and collects the feedback signal through first and second input terminals of the defect detector, one end of the first defect detection line is connected to the first output terminal of the defect detector through one conductive film, and the other end of the first defect detection line is connected to the first input terminal of the defect detector through another conductive film.

Preferably, the display device further includes a first connecting line and a first auxiliary line through which one end of the second defect detection line and the one conductive film are connected to each other, and a second connecting line and a second auxiliary line through which the other end of the second defect detection line and the another conductive film are connected to each other, wherein the one end of the second defect detection line is connected to a second output terminal of the defect detector through the first connecting line, the first auxiliary line, and one conductive film, the other end of the second defect detection line is connected to a second input terminal of the defect detector through the second connecting line, the second auxiliary line, and another conductive film, the first defect detection line, the second defect detection line, the first auxiliary line, and the second auxiliary line are formed in the same layer, the first connecting line and the second connecting line are formed in the same layer, and the first connecting line and the first defect detection line are formed in different layers.

Preferably, the conductive films are arranged along a longitudinal direction of the defect detection line, and conductive films which are located outermost among the conductive films are the one conductive film and the another conductive film, respectively.

Preferably, a data integrated circuit for providing a data signal to the pixels is embedded in at least one of the conductive films, and conductive films in which the data integrated circuit is not embedded are the one conductive film and the another conductive film, respectively.

Preferably, the number of the at least one defect detection line is n which is a natural number greater than 1, and the n defect detection lines cross different drive power transmission lines.

Preferably, the display device further includes a common electrode connected to one ends of the drive power transmission lines, wherein the n defect detection lines are located between a pixel region within which the pixels are present and the common electrode.

Preferably, the display device further includes at least one conductive film, wherein a defect detection signal is provided to each of the n defect detection lines through the at least one conductive film, a feedback signal from the n defect detection lines is provided to the defect detector through the at least one conductive film, and a feedback signal from the n defect detection lines is provided to the defect detector through the at least one conductive film.

Preferably, the at least one conductive film includes 2 or more conductive films, the defect detector outputs the defect detection signal through n output terminals of the defect detector and collects the feedback signal through n input terminals of the defect detector, one ends of the n defect detection lines are connected to the n output terminals of the defect detector through at least one conductive film, and the other ends of the n defect detection lines are connected to the n input terminals of the defect detector through at least one conductive film, a connecting line, and an auxiliary film.

Preferably, a data integrated circuit for providing a data signal to the pixels is embedded in at least one of the conductive films.

Preferably, the defect detector determines that there is no defect in the drive power transmission line upon determining that the defect detection signal and the feedback signal are identical and determines that there is a defect in the drive power transmission line upon determining that the defect detection signal and the feedback signal are different.

Preferably, when a plurality of feedback signals is present, the defect detector determines that there is no defect in the drive power transmission line upon determining that all the feedback signals are identical to the defect detection signal and determines that there is a defect in the drive power transmission line upon determining that at least one of the feedback signals is different from the defect detection signal.

Preferably, the display device further includes a drive power unit for generating a drive voltage to be provided to the drive power transmission lines, and a power controller for maintaining or preventing provision of the drive voltage generated by the drive power unit to the drive power transmission lines according to the determination of the defect detector.

Preferably, a pixel region within which the pixels are present is divided into a display area and a dummy area, and a part of the at least one defect detection line is a dummy gate line connected to dummy pixels in the dummy area.

Preferably, each of the pixels includes a light emitting diode, and the drive voltage is a voltage for driving the light emitting diode.

In another aspect of the present invention, a method for detecting line defects of a display device including a plurality of drive power transmission lines for transmitting drive power to pixels according to the present invention to achieve the above objects includes a first process including forming at least one defect detection line such that the at least one defect detection line crosses at least one drive power transmission line, and a second process including outputting a defect detection signal to the at least one defect detection line, collecting a feedback signal generated from the defect detection line according to the defect detection signal, and determining whether or not there is a defect in the at least one drive power transmission line based on comparison between the defect detection signal and the feedback signal.

Preferably, the second process includes determining that there is no defect in the drive power transmission line upon determining that the defect detection signal and the feedback signal are identical, and determining that there is a defect in the drive power transmission line upon determining that the defect detection signal and the feedback signal are different.

Preferably, when a plurality of feedback signals is present, the second process includes determining that there is no defect in the drive power transmission line upon determining that the feedback signals are identical to the defect detection signal, and determining that there is a defect in the drive power transmission line upon determining that at least one of the feedback signals is different from the defect detection signal.

Preferably, the method further includes a third process including generating a drive voltage to be provided to the drive power transmission lines, and a fourth process including maintaining or preventing provision of the drive voltage generated in the third process to the drive power transmission lines according to the determination of the second process.

Preferably, a pixel region within which the pixels are present is divided into a display area and a dummy area, and a part of the at least one defect detection line is a dummy gate line connected to dummy pixels in the dummy area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
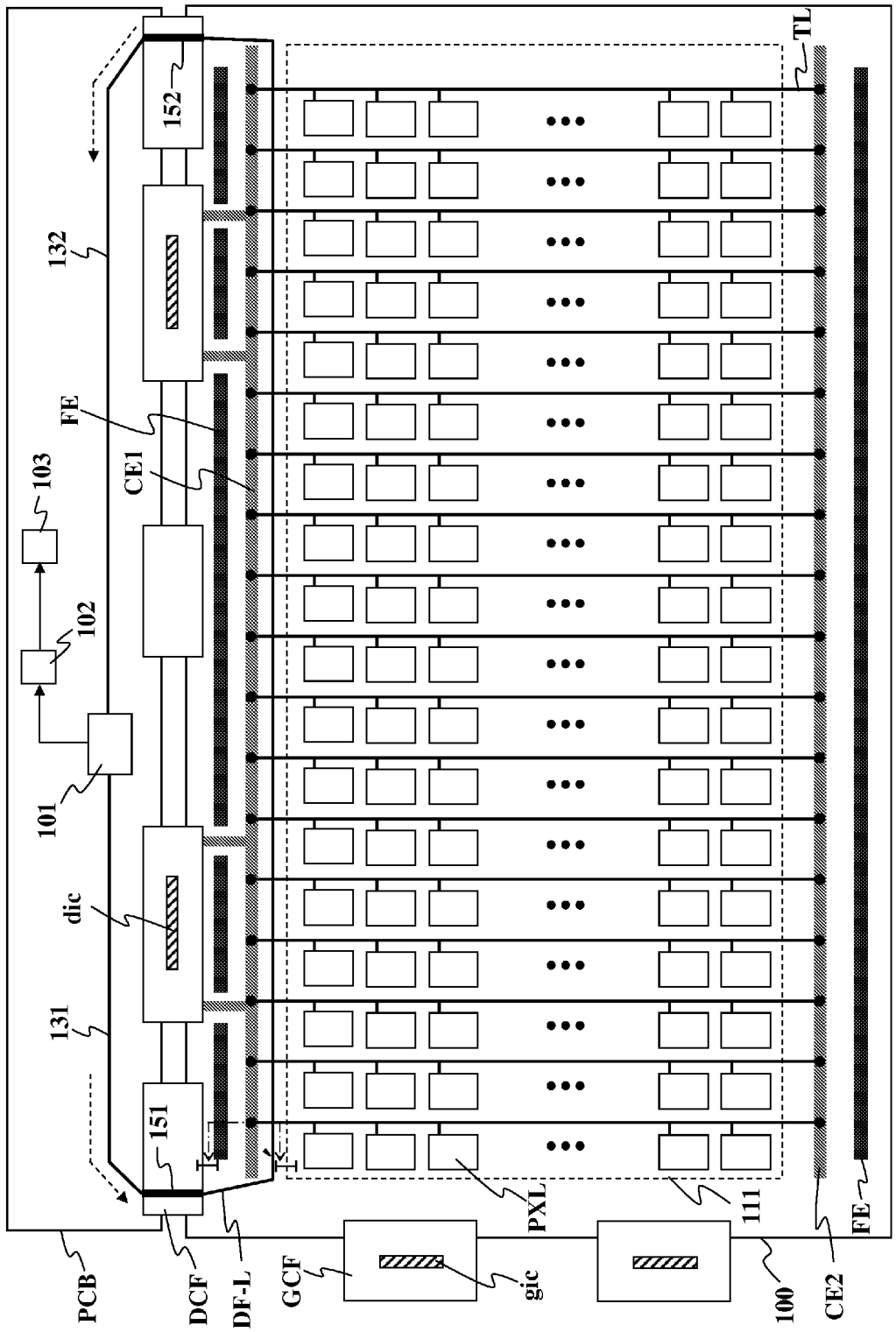
FIG. 1 illustrates a display device according to a first embodiment of the present invention.

FIG. 1 illustrates a display device according to a first embodiment of the present invention.

As shown in FIG. 1, the display device according to the first embodiment of the present invention includes a plurality of drive power transmission lines TL for transmitting drive power to pixels PXL, a defect detection line DF-L which crosses the drive power transmission lines TL, and a defect detector 101 for determining whether or not there is a defect in the drive power transmission lines TL according to a signal detected from the defect detection line DF-L.

In the present invention, it is possible to easily determine whether or not there is a defect in the drive power transmission lines TL by checking the state of a signal from the defect detection line DF-L which crosses the drive power transmission lines TL as described above.

The components described above and peripheral components associated with the components are described below in more detail to show detailed configurations and advantages of the present invention.

The pixels PXL are formed on a lower substrate 100. Specifically, the pixels PXL are formed in a matrix on a pixel region 111 (which is the inside of a dotted box in FIG. 1) of the lower substrate 100.

The pixels PXL are divided into red pixels for displaying red images, green pixels for displaying green images, and blue pixels for displaying blue images. The pixels PXL may further include pixels for displaying images of other colors, for example, white pixels for displaying white images.

Pixels PXL arranged in a column, i.e., pixels PXL commonly connected to a data line (not shown), are commonly connected to a drive power transmission line TL.

Such drive power transmission lines TL transmit drive power, which is required for the pixels PXL to emit light of the corresponding colors, to the pixels PXL. The drive power is generated by a drive power unit 103 and is then provided to the drive power transmission lines TL through a first common electrode CE1. To accomplish this, the drive power transmission lines TL are connected to the first common electrode CE1. Specifically, one ends of the drive power transmission lines TL are all connected to the first common electrode CE1.

The other ends of the drive power transmission lines TL are all connected to a second common electrode CE2. Connection of the other ends of the drive power transmission lines TL to the second common electrode CE2 prevents floating of the drive power transmission lines TL. Thus, it is possible to prevent voltage and current drop (i.e., IR drop) of the drive power transmission lines TL.

The first common electrode CE1 may be connected to the drive power unit 103 described above through data conductive films DCF. For example, the first common electrode CE1 may be connected to the drive power unit 103 through a transmission line formed on the data conductive films DCF and another transmission line formed on a printed circuit board PCB.

The defect detection line DF-L is formed on the lower substrate 100 such that the defect detection line DF-L crosses all drive power transmission lines TL. To accomplish this, as shown in FIG. 1, the defect detection line DF-L may be located between the pixel region 111 and the first common electrode CE1. That is, the drive power transmission lines TL extend to the sides of the first common electrode CE1 and the second common electrode CE2 across the pixel region 111 and the defect detection line DF-L crosses one end portions of the drive power transmission lines TL which are located adjacent to the first common electrode CE1 among both end portions of the drive power transmission lines TL which are located outside the pixel region 111.

The defect detector 101 outputs a defect detection signal to the defect detection line DF-L and collects a feedback signal that the defect detection line DF-L generates according to the defect detection signal. The defect detector 101 determines whether or not there is a defect in the drive power transmission lines TL based on comparison between the defect detection signal and the feedback signal. For example, the defect detector 101 determines that there is no defect in the drive power transmission lines TL upon determining that the defect detection signal and the feedback signal are identical. On the other hand, the defect detector 101 determines that there is a defect in the drive power transmission lines TL upon determining that the defect detection signal and the feedback signal are different.

Here, the case in which the defect detection signal and the feedback signal are identical includes not only the case in which the two signals (i.e., the defect detection signal and the feedback signal) are exactly the same ideally but also the case in which the two signals are identical within a preset allowable error range. That is, even when the two signals are not exactly the same, the defect detector 101 may determine that the two signals are identical if the two signals are located within a preset allowable error range. On the other hand, when the two signals are not the same or are not within the allowable error range, the defect detector 101 may determine that the two signals are not identical.

The allowable error range may be set taking into consideration the resistance and capacitance of the defect detection line DF-L.

One end of the defect detection line DF-L is connected to an output terminal of the defect detector 101 and the other end of the defect detection line DF-L is connected to an input terminal of the defect detector 101. The defect detection signal is output from the output terminal of the defect detector 101. For example, a clock signal having a specific period and duty may be used as the defect detection signal.

The one end of the defect detection line DF-L may be connected to the output terminal of the defect detector 101 through the data conductive film DCF. Specifically, the one end of the defect detection line DF-L may be connected to the output terminal of the defect detector 101 through one transmission line formed on one data conductive film DCF and another transmission line formed on the printed circuit board PCB. For example, as shown in FIG. 1, the one end of the defect detection line DF-L may be connected to the defect detector 101 through a transmission line 151 formed on a data conductive film DCF that is located leftmost and a transmission line 131 in the printed circuit board PCB.

The other end of the defect detection line DF-L may be connected to the input terminal of the defect detector 101 through the data conductive film DCF. Specifically, the other end of the defect detection line DF-L may be connected to the input terminal of the defect detector 101 through a transmission line formed on another data conductive film DCF and another transmission line formed on the printed circuit board PCB. For example, as shown in FIG. 1, the other end of the defect detection line DF-L may be connected to the defect detector 101 through a transmission line 152 in a data conductive film DCF that is located rightmost and a transmission line 132 in the printed circuit board PCB.

Although not shown, the one end and the other end of the defect detection line DF-L shown in FIG. 1 may be connected to the defect detector 101 through the same data conductive film DCF. However, the one end and the other end of the defect detection line DF-L are connected to different transmission lines in the data conductive film DCF.

The data conductive films DCF shown in FIG. 1 transfer signals from various drive circuits formed on the printed circuit board PCB to various circuits and pixels PXL formed on the lower substrate 100. To accomplish this, one ends of the data conductive films DCF are connected to the printed circuit board PCB and the other ends thereof are connected to the lower substrate 100.

A data integrated circuit dic is embedded in a part of the data conductive films DCF. The data integrated circuit dic serves to provide data signals to the pixels PXL through data lines.

A Film On Glass (FOG) type of anisotropic conductive film may be used as the data conductive film DCF in which the data integrated circuit dic is embedded and a Chip On Film (COF) type of anisotropic conductive film may also be used as the data conductive film DCF in which the data integrated circuit dic is embedded.

On the other hand, in the example of FIG. 1, the one end and the other end of the defect detection line DF-L are connected to data conductive films DCF in each of which no data integrated circuit dic is embedded. However, the one end and the other end of the defect detection line DF-L may all be connected to data conductive films DCF in each of which a data integrated circuit dic is embedded and the one end and the other end of the defect detection line DF-L may also be connected to two different types of data conductive films DCF.

Gate conductive films GCF are connected to the lower substrate 100 to transmit various signals from the printed circuit board PCB to pixels PXL and various circuits.

A gate integrated circuit gic is embedded in each gate conductive film GCF. The gate integrated circuit gic drives gate lines (not shown) formed on the lower substrate 100. The gate integrated circuit gic may receive various signals required to drive the gate lines through a data conductive film DCF that is located leftmost.

Counter electrodes FE shown in FIG. 1 are formed on the lower substrate 100. Specifically, some of the counter electrodes FE are formed between the first common electrode CE1 and the data conductive film DCF and the remaining counter electrodes FE are formed between the second common electrode CE2 and an edge of the lower substrate 100. The counter electrodes FE receive counter voltage from the drive power unit 103 through the data conductive films DCF.

The counter electrodes FE are connected to a counter common electrode (not shown) formed on an upper substrate (not shown). The counter common electrode is commonly connected to all pixels PXL formed on the lower substrate 100. Thus, a counter voltage from the counter electrode FE is applied to the pixels PXL through the counter common electrode.

The display device according to the present invention may further include a power controller 102. The power controller 102 and the defect detector 101 and the drive power unit 103 which are described above may all be formed on the printed circuit board PCB.

The power controller 102 maintains or prevents provision of a drive voltage generated by the drive power unit 103 to the drive power transmission lines TL according to a determination result from the defect detector 101. For example, when the defect detector 101 has determined that there is a defect in the drive power transmission lines TL, the power controller 102 interrupts an electrical connection between the power controller 102 and the first common electrode CE1 to prevent drive power from being supplied to the first common electrode CE1 and the drive power transmission lines TL.

According to the present invention, when there is a defect in the drive power transmission lines TL, drive power is prevented from being supplied to the first common electrode CE1 and the drive power transmission lines TL as described above and therefore it is possible to prevent damage which is caused to the first common electrode CE1 by current concentration into the first common electrode CE1 due to a defect in the drive power transmission lines TL as in the related art.

A positional relationship between the defect detection line DF-L and the drive power transmission lines TL is described below in detail with reference to FIG. 2.

Figure 2:
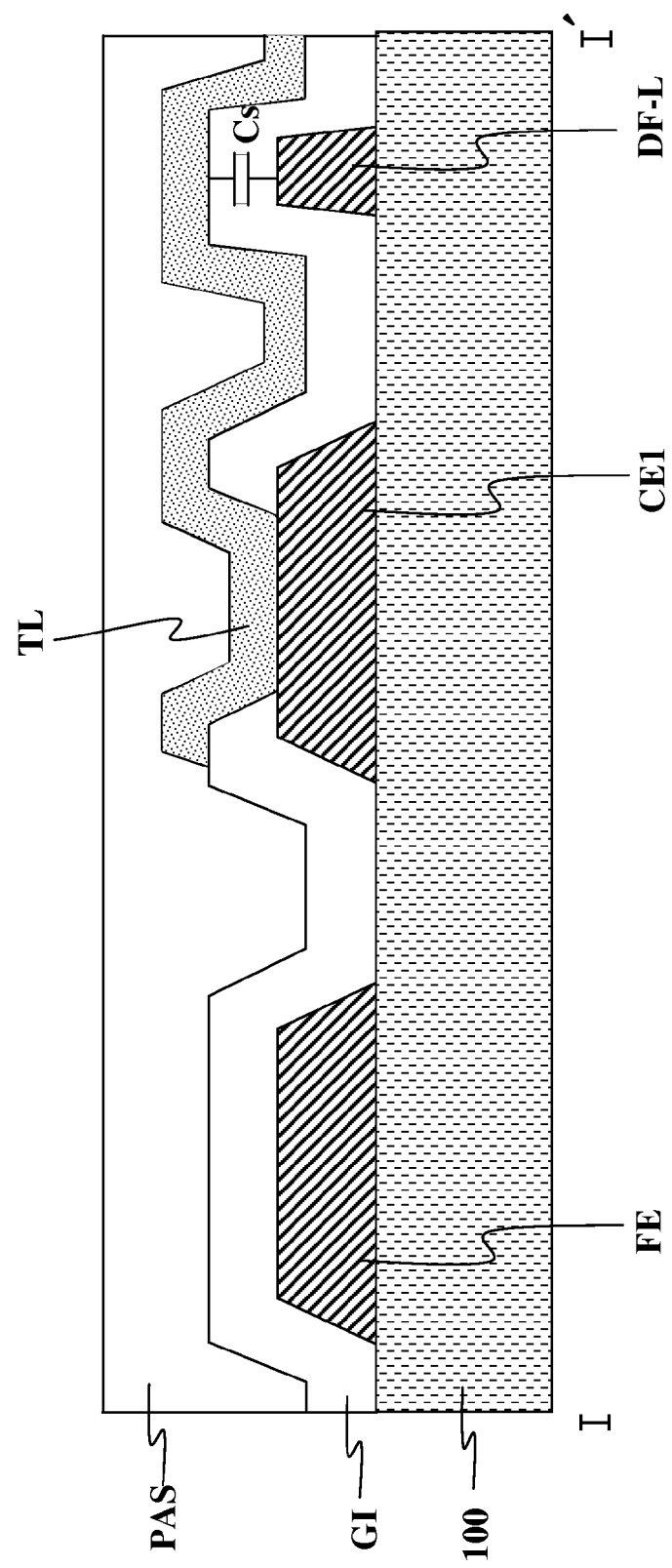
FIG. 2 is a cross-sectional view taken along line I-I' of FIG. 1.

FIG. 2 is a cross-sectional view taken along line I-I' of FIG. 1.

As shown in FIG. 2, a counter electrode FE, a first common electrode CE1, and a defect detection line DF-L which are made of a gate metal substance are all formed on the lower substrate 100 in the same layer. A gate insulating layer is formed on the counter electrode FE, the first common electrode CE1, and the defect detection line DF-L. Here, a contact hole is formed in the gate insulating layer such that the contact hole passes through part of the gate insulating layer, exposing part of the first common electrode CE1 which is located below the gate insulating layer. A drive power transmission line TL is formed on the gate insulating layer and one end of the drive power transmission line TL is electrically connected to the first common electrode CE1 which is exposed through the contact hole. The drive power transmission line TL crosses the defect detection line DF-L with the gate insulating layer therebetween. The drive power transmission line TL may be formed of a data metal substance. In this manner, the drive power transmission line TL and the defect detection line DF-L are formed of different substances in different layers. A capacitor is formed at a location at which the drive power transmission line TL and the defect detection line DF-L cross each other. If a defect occurs in the defect detection line DF-L, for example, due to open or short-circuit, the capacitance of the capacitor Cs changes, which may change a feedback signal detected from the defect detection line DF-L. As a result, a defect in the drive power transmission lines TL causes a change in the feedback signal of the defect detection line DF-L, thereby providing information which allows the defect detector 101 to determine whether or not there is a defect in the drive power transmission lines TL.

Figure 3:
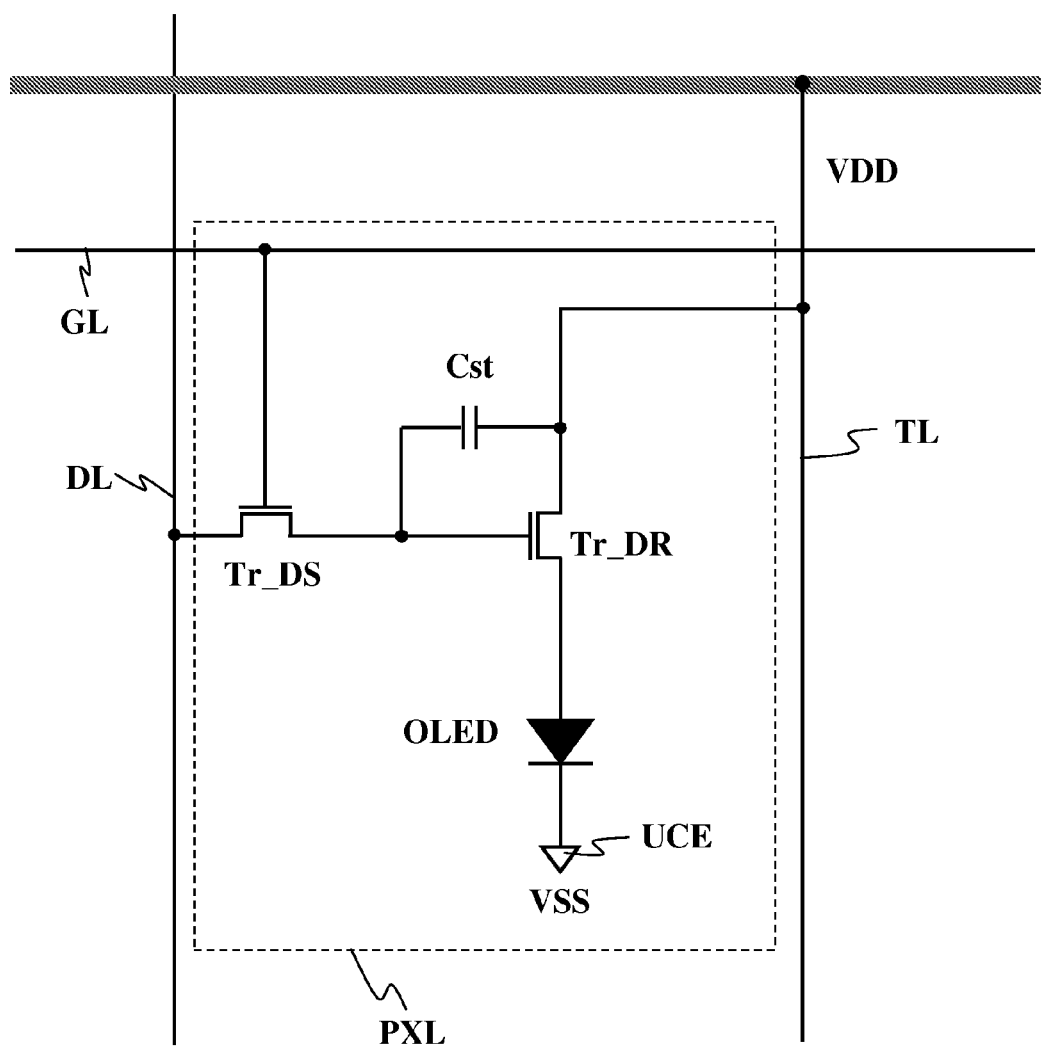
FIG. 3 illustrates a detailed configuration of a pixel of FIG. 1.

FIG. 3 illustrates a detailed configuration of a pixel PXL of FIG. 1.

The display device of the present invention may be a light emitting diode display device. Here, one pixel PXL may include a data switching element Tr_DS, a drive switching element Tr_DR, a light emitting diode OLED, and a storage capacitor Cst as shown in FIG. 3.

The data switching element Tr_DS is controlled according to a gate signal from the gate line GL and is connected between the data line DL and a gate of the drive switching element Tr_DR.

The drive switching element Tr_DR is controlled according to a data signal from the data switching element Tr_DS and is connected between the drive power transmission line TL and an anode of the light emitting diode OLED.

A cathode of the light emitting diode OLED is connected to the counter common electrode UCE described above.

The storage capacitor Cst is connected between the gate of the drive switching element Tr_DR and the drive power transmission line TL.

When the drive switching element Tr_DR is turned on a data signal, a drive voltage VDD is applied to the anode of the light emitting diode OLED through the turned-on drive switching element Tr_DR. Accordingly, the light emitting diode OLED emits light according to the counter voltage VSS and the drive voltage VSS.

Figure 4:
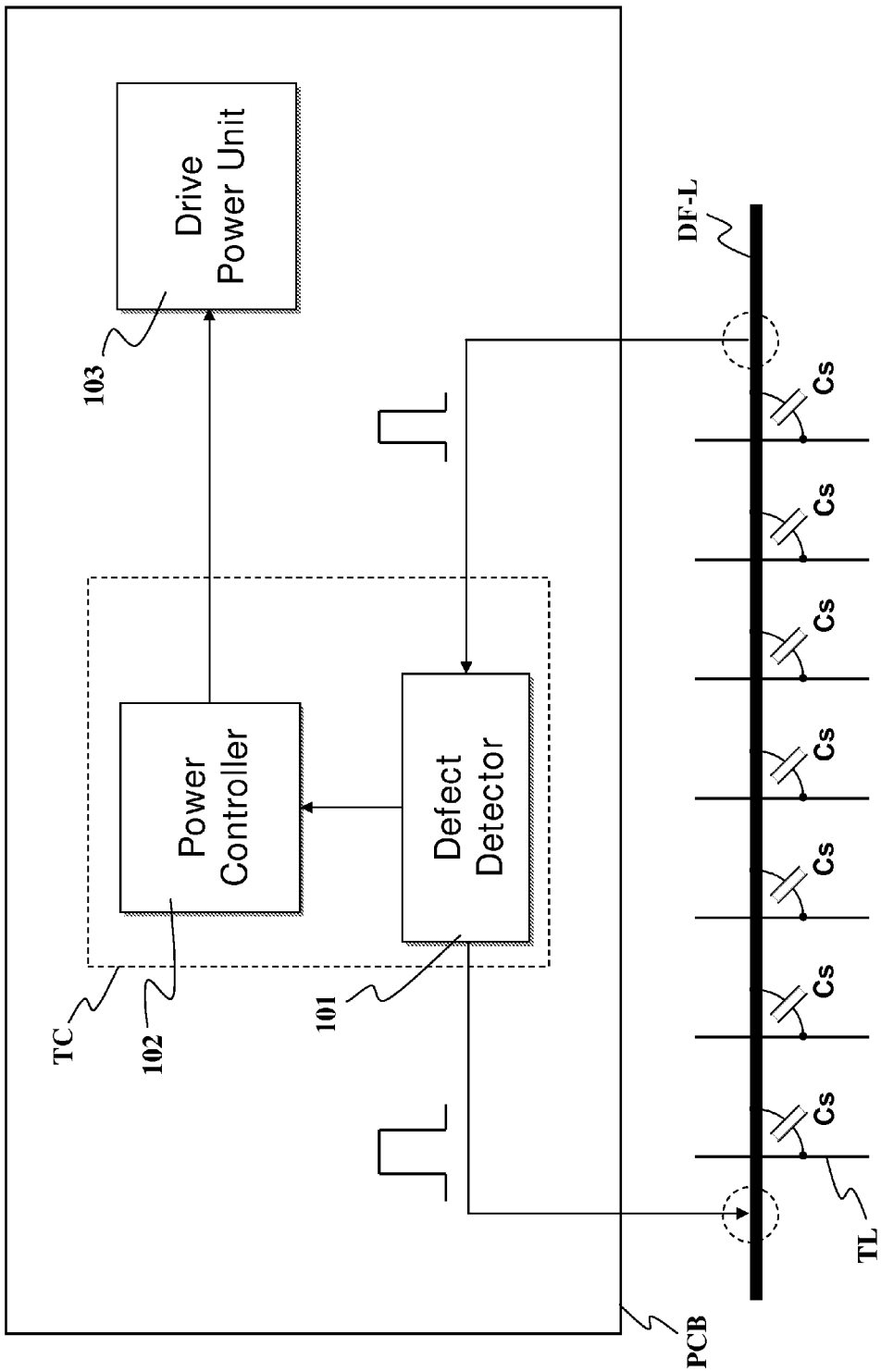
FIG. 4 illustrates operations of a defect detector, a power controller, and a drive power unit of FIG. 1.

FIG. 4 illustrates operations of the defect detector 101, the power controller 102, and the drive power unit 103 of FIG. 1.

As shown in FIG. 4, the defect detector 101 transmits a defect detection signal to one end of the defect detection line DF-L. The defect detector 101 receives a feedback signal generated by the defect detection signal from the other end of the defect detection line DF-L. The defect detector 101 then determines whether or not there is a defect in the drive power transmission line TL based on comparison between the defect detection signal and the feedback signal.

The power controller 102 controls operation of the drive power unit 103 according to a determination result from the defect detector 101. For example, when the defect detector 101 determines that none of the drive power transmission lines TL is out of order, the power controller 102 controls operation of the drive power unit 103 to allow a drive voltage from the drive power unit 103 to be normally provided to the drive power transmission lines TL through the first common electrode CE1. On the other hand, when the defect detector 101 determines that any of the drive power transmission lines TL is out of order, the power controller 102 controls operation of the drive power unit 103 to prevent a drive voltage from the drive power unit 103 from being applied to the first common electrode CE1.

As shown in FIG. 4, a capacitor Cs is formed at each intersection between the defect detection line DF-L and the drive power transmission lines TL.

The defect detector 101 and the power controller 102 may be embedded in the timing controller TC. The timing controller TC arranges and provides data signals to the data integrated circuit dic and generates various control signals for controlling drive timing of the data integrated circuit dic. The timing controller TC is also formed in the printed circuit board.

Figure 5:
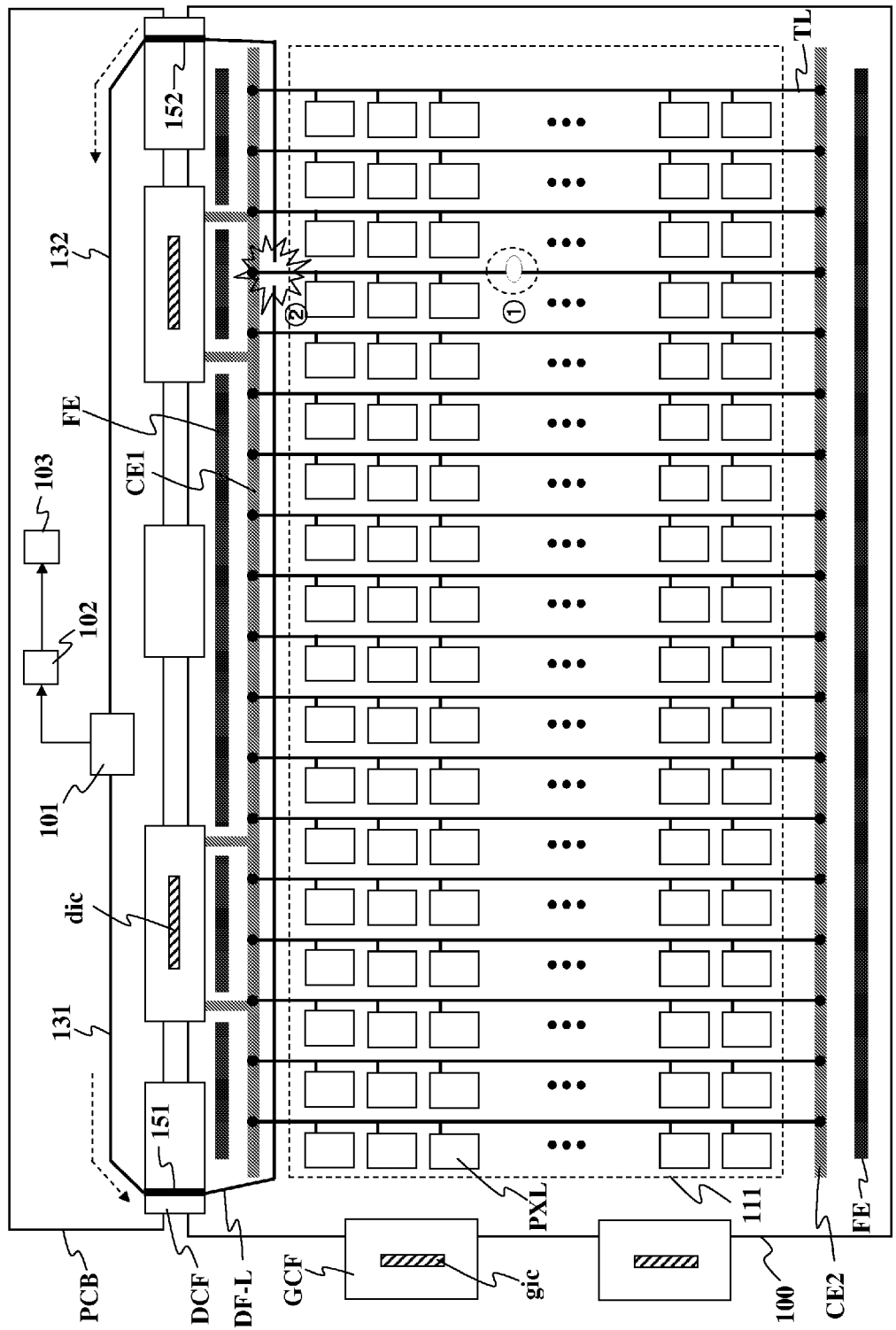
FIGS. 5 to 7 illustrate defect types and states of a defect detection line of the present invention according to the defect types.
Figure 6:
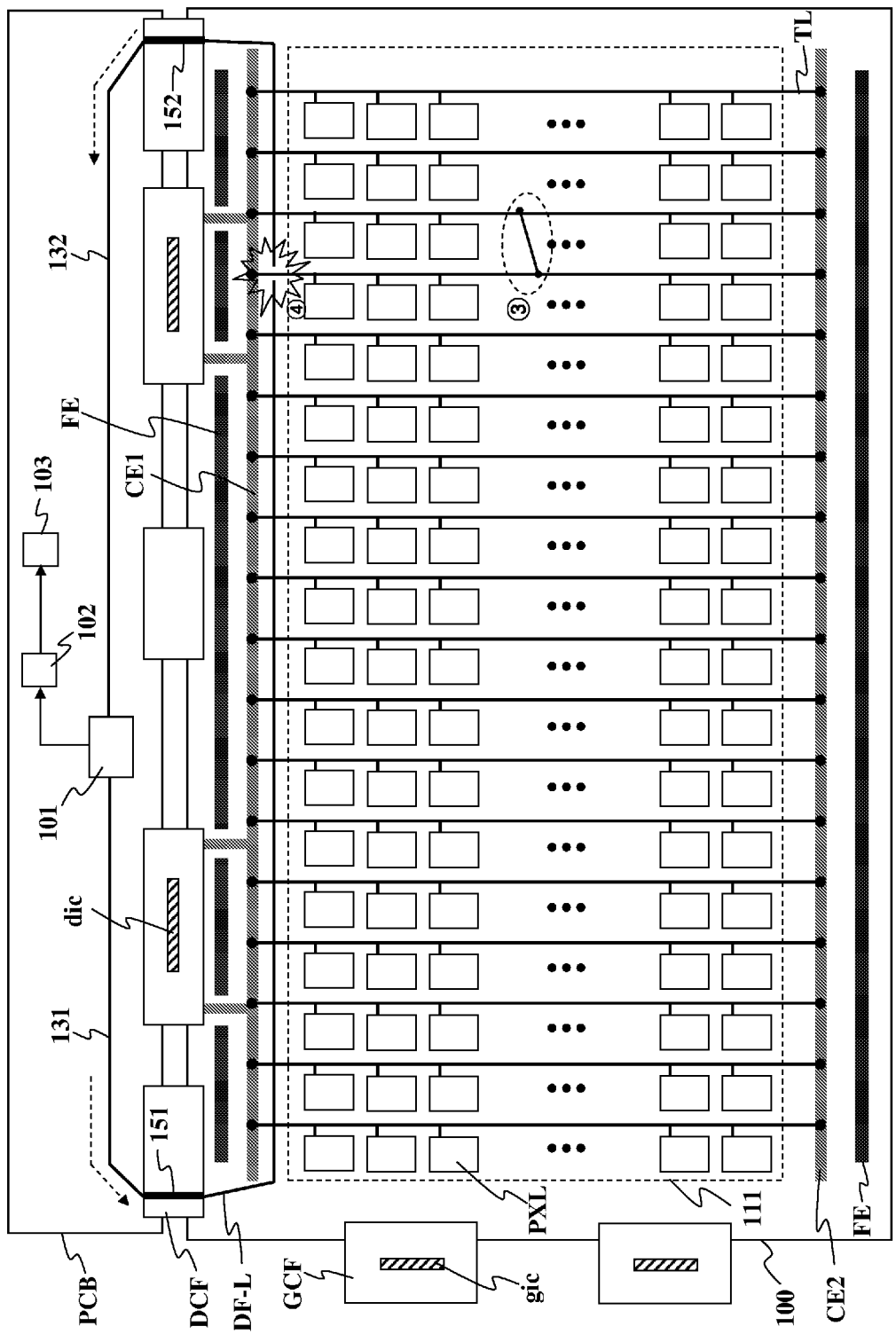
Figure 7:
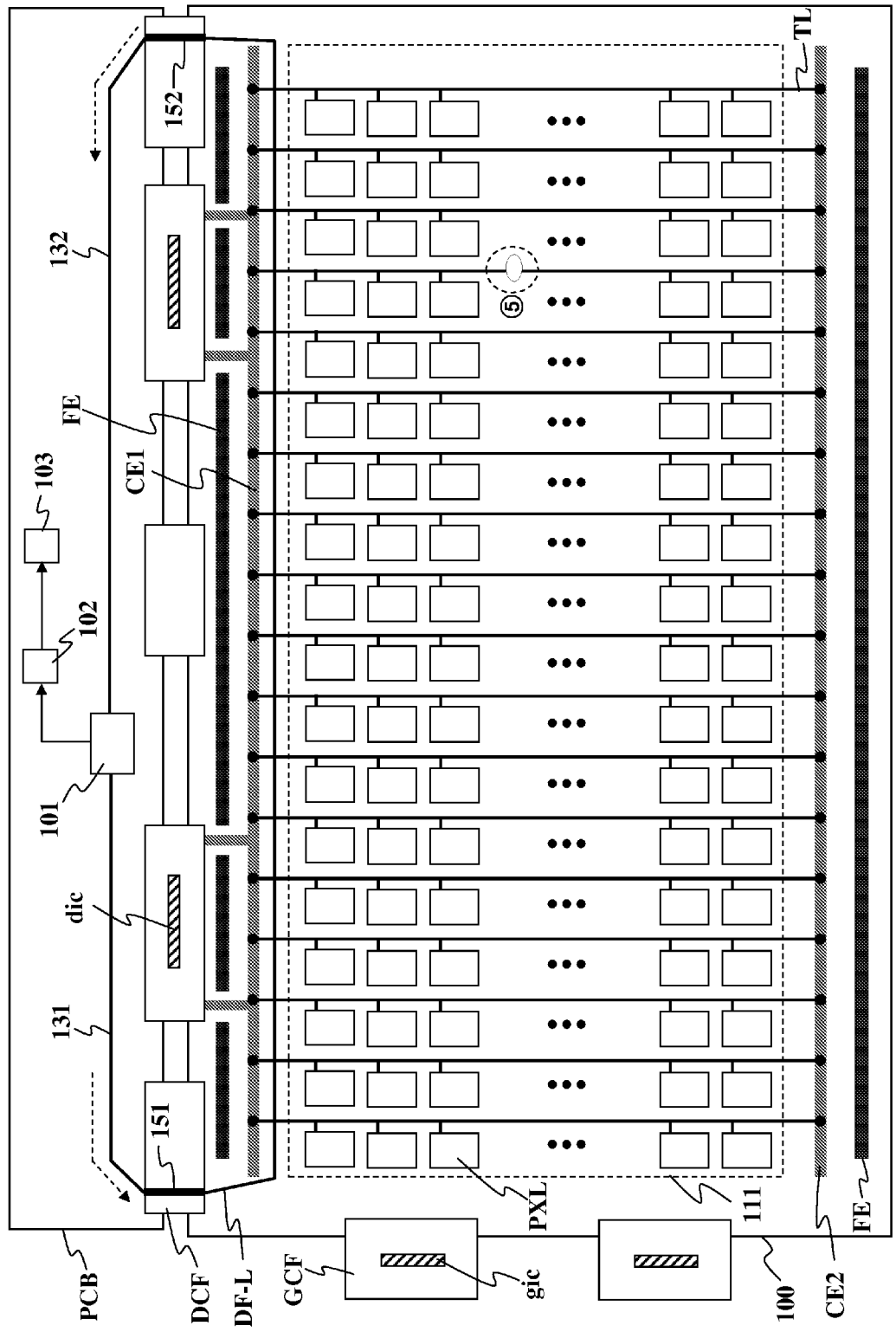

FIGS. 5 to 7 illustrate defect types and states of the defect detection line DF-L of the present invention according to the defect types.

If an open defect occurs in a part ① of a specific drive power transmission line TL and current concentration occurs in a part ② of a connection portion between the specific drive power transmission line TL and the first common electrode CE1 due to the open defect as shown in FIG. 5, the part ② may generate a great amount of heat. The generated heat may damage a defect detection line DF-L located at the part ②, thereby opening the defect detection line DF-L. Thus, a defect detection signal applied to the defect detection line DF-L and a feedback signal collected from the defect detection line DF-L have different forms. Accordingly, the defect detector 101 determines that there is a defect in at least one drive power transmission line TL and thus a drive voltage is no longer applied to the drive power transmission lines TL.

If a short-circuit defect occurs in a part ③ of a specific drive power transmission line TL and current concentration occurs in a part ④ of a connection portion between the specific drive power transmission line TL and the first common electrode CE1 due to the short-circuit defect as shown in FIG. 6, the part ④ may generate a great amount of heat. The generated heat may damage a defect detection line DF-L located at the part ④, thereby short-circuiting the defect detection line DF-L. Thus, a defect detection signal applied to the defect detection line DF-L and a feedback signal collected from the defect detection line DF-L have different forms. Accordingly, the defect detector 101 determines that there is a defect in at least one drive power transmission line TL and thus a drive voltage is no longer applied to the drive power transmission lines TL.

If an open defect occurs in a part ⑤ of a specific drive power transmission line TL and current concentration occurs in a part of a connection portion between the specific drive power transmission line TL and the first common electrode CE1 due to the short-circuit defect as shown in FIG. 7, the part may generate a great amount of heat. Despite the generated heat, a defect detection line DF-L located at the part may not be opened. However, the capacitance of a capacitor Cs formed at each intersection between the defect detection line DF-L and the drive power transmission lines TL changes since the specific drive power transmission line TL is opened. That is, the total capacitance between the defect detection line DF-L and the drive power transmission lines TL including the specific drive power transmission line TL which is opened is different from the total capacitance between the defect detection line DF-L and the drive power transmission lines TL which are all in a normal state (i.e., none of which are opened). Thus, a defect detection signal applied to the defect detection line DF-L and a feedback signal detected from the defect detection line DF-L have different waveforms. Accordingly, the defect detector 101 determines that there is a defect in at least one drive power transmission line TL and thus a drive voltage is no longer applied to the drive power transmission lines TL.

Figure 8:
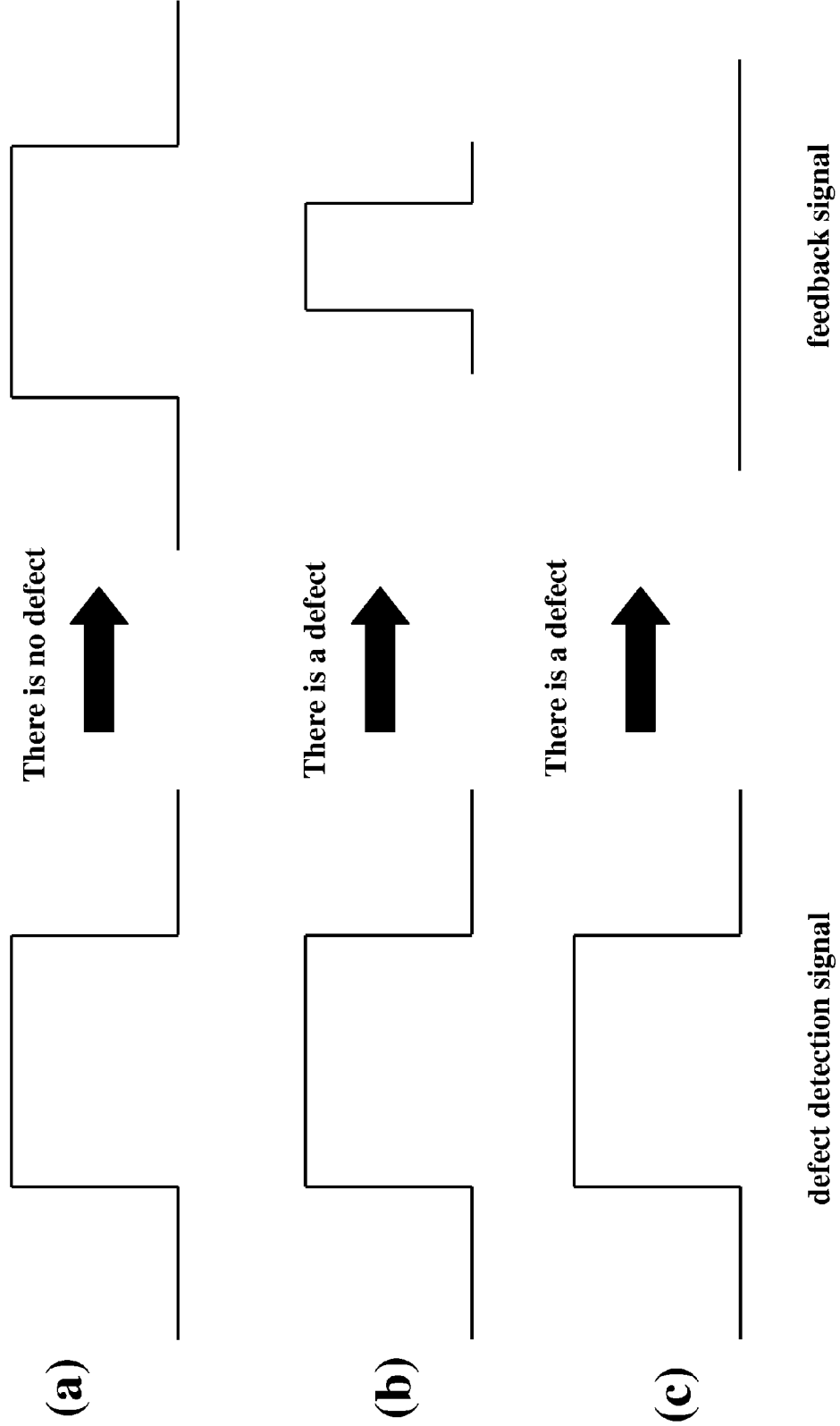
FIG. 8 illustrates how whether or not there is a defect is determined according to comparison between a defect detection signal and a feedback signal.

FIG. 8 illustrates how whether or not there is a defect is determined according to comparison between a defect detection signal and a feedback signal.

It is determined that there is no defect in the drive power transmission lines TL when a defect detection signal input to the defect detection line DF-L and a feedback signal generated by the defect detection signal are identical as shown in FIG. 8(a).

It is determined that there is a defect in at least one drive power transmission line TL when a defect detection signal input to the defect detection line DF-L and a feedback signal generated by the defect detection signal are different as shown in FIGS. 8(b) and 8(c).

Second Embodiment

Figure 9:
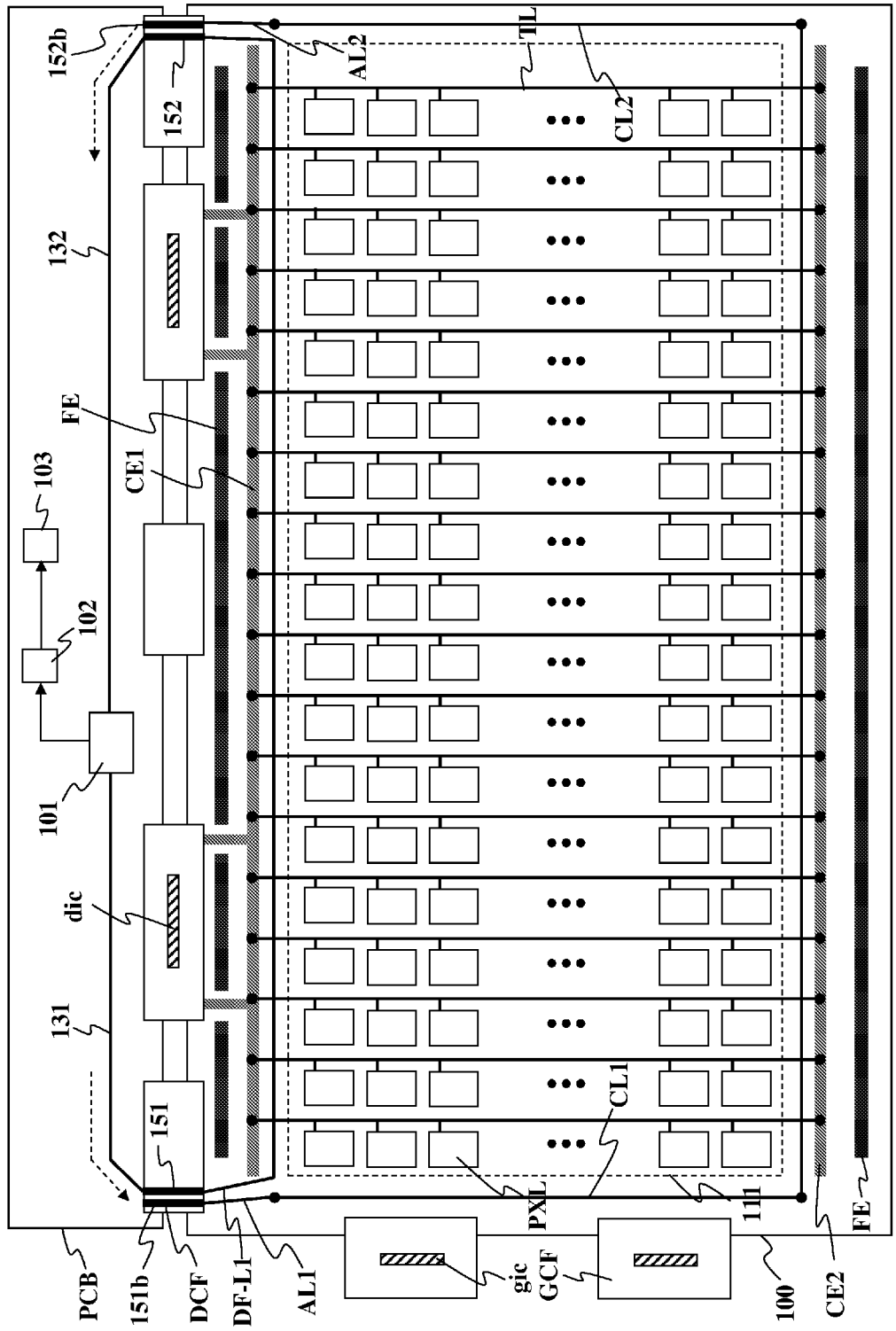
FIG. 9 illustrates a display device according to a second embodiment of the present invention.

FIG. 9 illustrates a display device according to a second embodiment of the present invention.

As shown in FIG. 9, the display device according to the second embodiment of the present invention includes a plurality of drive power transmission lines TL for transmitting drive power to pixels PXL, first and second defect detection lines DF-L1 and DF-L2 which cross the drive power transmission lines TL, and a defect detector 101 for determining whether or not there is a defect in the drive power transmission lines TL according to signals detected from the first and second defect detection lines DF-L1 and DF-L2.

In the second embodiment, it is possible to easily determine whether or not there is a defect in the drive power transmission lines TL by checking the states of signals from the first and second defect detection lines DF-L1 and DF-L2 which cross the drive power transmission lines TL as described above.

Here, a lower substrate 100, a pixel region 111, pixels PXL, drive power transmission lines TL, a first common electrode CE1, a second common electrode CE2, counter electrodes FE, data conductive films DCF, gate conductive films GCF, a data integrated circuit dic, a gate integrated circuit gic, gate lines, data lines, a printed circuit board PCB, a power controller 102, a drive power unit 103, and an upper substrate of the second embodiment are similar to those described above with reference to the first embodiment and therefore, for details of these components, refer to the above description of the first embodiment.

In addition, the first defect detection line DF-L1 of the second embodiment is similar to the defect detection line DF-L of the first embodiment described above and therefore, for details of the first defect detection line DF-L1, refer to the above description of the first embodiment.

The second defect detection line DF-L2 is formed on the lower substrate 100 such that the defect detection line DF-L crosses all drive power transmission lines TL. To accomplish this, as shown in FIG. 9, the second defect detection line DF-L2 may be located between the pixel region 111 and the second common electrode CE2. That is, the drive power transmission lines TL extend to the sides of the first common electrode CE1 and the second common electrode CE2 across the pixel region 111 and the second defect detection line DF-L2 crosses the other end portions of the drive power transmission lines TL which are located adjacent to the second common electrode CE2 among both end portions of the drive power transmission lines TL which are located outside the pixel region 111.

The defect detector 101 outputs respective defect detection signals to the first and second defect detection lines DF-L1 and DF-L2 and collects feedback signals that the first and second defect detection lines DF-L1 and DF-L2 generate according to the defect detection signals. The defect detector 101 then determines whether or not there is a defect in the drive power transmission lines TL based on respective comparisons between the defect detection signals and the feedback signals. For example, the defect detector 101 determines that there is no defect in the drive power transmission lines TL upon determining that the defect detection signal applied to the first defect detection line DF-L1 and the feedback signal from the first defect detection line DF-L1 are identical and the defect detection signal applied to the second defect detection line DF-L2 and the feedback signal from the second defect detection line DF-L2 are identical. On the other hand, the defect detector 101 determines that there is a defect in at least one drive power transmission line TL upon determining that at least one of the feedback signal from the first defect detection line DF-L1 and the feedback signal from the second defect detection line DF-L2 is different from the corresponding defect detection signal.

Here, the case in which the defect detection signal and the feedback signal are identical includes not only the case in which the two signals (i.e., the defect detection signal and the feedback signal) are exactly the same ideally but also the case in which the two signals are identical within a preset allowable error range. That is, even when the two signals are not exactly the same, the defect detector 101 may determine that the two signals are identical if the two signals are located within a preset allowable error range. On the other hand, when the two signals are not the same or are not within the allowable error range, the defect detector 101 may determine that the two signals are not identical.

The allowable error range may be set taking into consideration the resistance and capacitance of the first and second defect detection lines DF-L1 and DF-L2.

One end of the second defect detection line DF-L2 is connected to an output terminal of the defect detector 101 and the other end of the second defect detection line DF-L2 is connected to an input terminal of the defect detector 101. The defect detection signal is output from the output terminal of the defect detector 101. For example, a clock signal having a specific period and duty may be used as the defect detection signal.

The one end of the second defect detection line DF-L2 may be connected to the output terminal of the defect detector 101 through a first connecting line CL1, a first auxiliary line AL1, and a data conductive film DCF. Specifically, the one end of the second defect detection line DF-L2 may be connected to the output terminal of the defect detector 101 through a transmission line formed on the first connecting line CL1, the first auxiliary line AL1, and one data conductive film DCF and another transmission line formed on the printed circuit board PCB. For example, as shown in FIG. 9, the one end of the second defect detection line DF-L2 may be connected to the defect detector 101 through a transmission line 151b formed in the first connecting line CL1, the first auxiliary line AL1, and a data conductive film DCF that is located leftmost and another transmission line (not shown) formed in the printed circuit board PCB.

The other end of the second defect detection line DF-L2 may be connected to the input terminal of the defect detector 101 through a second connecting line CL2, a second auxiliary line AL2, and a data conductive film DCF. Specifically, the other end of the second defect detection line DF-L2 may be connected to the input terminal of the defect detector 101 through a transmission line formed on the second connecting line CL2, the second auxiliary line AL2 and another data conductive film DCF and another transmission line formed on the printed circuit board PCB. For example, as shown in FIG.

9, the other end of the second defect detection line DF-L2 may be connected to the defect detector 101 through a transmission line 152b formed in the second connecting line CL2, the second auxiliary line AL2, and a data conductive film DCF that is located rightmost and a transmission line (not shown) formed in the printed circuit board PCB.

Although not shown, the one end and the other end of the second defect detection line DF-L2 shown in FIG. 9 may be connected to the defect detector 101 through the same data conductive film DCF. However, the one end and the other end of the second defect detection line DF-L2 are connected to different transmission lines in the data conductive film DCF.

Here, the second defect detection line DF-L2 cannot be directly connected to the data conductive films DCF because gate lines (not shown) formed in the same layer as the second defect detection line DF-L2 are located between the data conductive films DCF and the second defect detection line DF-L2.

On the other hand, the first connecting line CL1 and the second connecting line CL2 may each be directly connected to the second defect detection line DF-L2 without the first auxiliary line AL1 and the second auxiliary line AL2.

Third Embodiment

Figure 10:
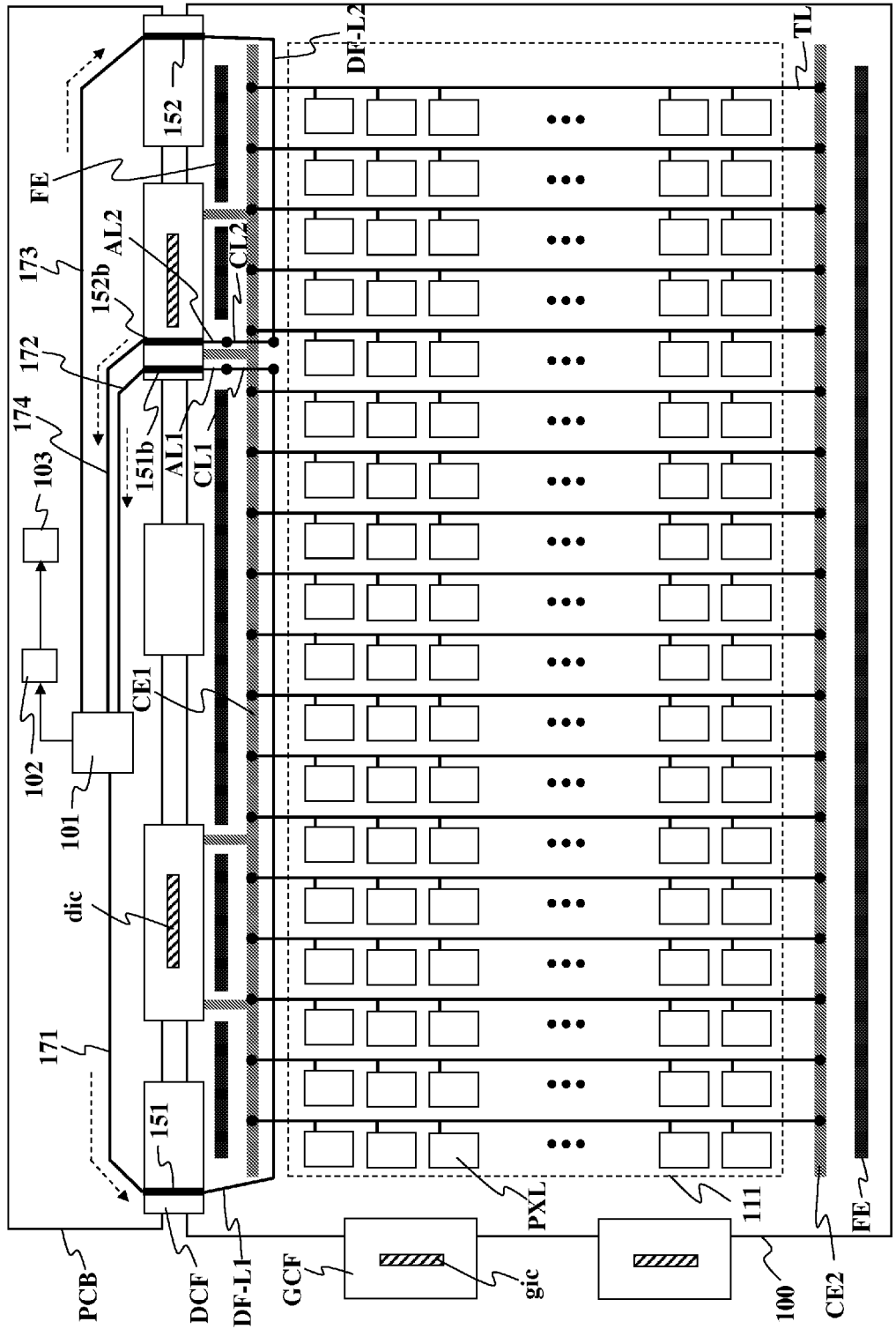
FIG. 10 illustrates a display device according to a third embodiment of the present invention.

FIG. 10 illustrates a display device according to a third embodiment of the present invention.

As shown in FIG. 10, the display device according to the third embodiment of the present invention includes a plurality of drive power transmission lines TL for transmitting drive power to pixels PXL, first and second defect detection lines DF-L1 and DF-L2 which cross different drive power transmission lines TL, and a defect detector 101 for determining whether or not there is a defect in the drive power transmission lines TL according to signals detected from the first and second defect detection lines DF-L1 and DF-L2.

In the third embodiment, it is possible to easily determine whether or not there is a defect in the drive power transmission lines TL by checking the states of signals from the first and second defect detection lines DF-L1 and DF-L2 which cross different groups of drive power transmission lines TL as described above.

Here, a lower substrate 100, a pixel region 111, pixels PXL, drive power transmission lines TL, a first common electrode CE1, a second common electrode CE2, counter electrodes FE, data conductive films DCF, gate conductive films GCF, a data integrated circuit dic, a gate integrated circuit gic, gate lines, data lines, a printed circuit board PCB, a power controller 102, a drive power unit 103, and an upper substrate of the third embodiment are similar to those described above with reference to the first embodiment and therefore, for details of these components, refer to the above description of the first embodiment.

When the number of the drive power transmission lines TL is n, the first defect detection line DF-L1 may be formed on the lower substrate 100 such that the first defect detection line DF-L1 crosses p drive power transmission lines TL (where p is a natural number less than n) and the second defect detection line DF-L2 may be formed on the lower substrate 100 such that the second defect detection line DF-L2 crosses n-p drive power transmission lines TL.

Each of the first and second defect detection lines DF-L1 and DF-L2 is used to determine whether or not there is a defect in drive power transmission lines TL which the defect detection line DF-L crosses. For example, the first defect detection line DF-L1 is used to determine whether or not there is a defect in the p drive power transmission lines TL and the second defect detection line DF-L2 is used to determine whether or not there is a defect in the n-p drive power transmission lines TL.

The first and second defect detection lines DF-L1 and DF-L2 may be located between the pixel region 111 and the first common electrode CE1. That is, the drive power transmission lines TL extend to the sides of the first common electrode CE1 and the second common electrode CE2 across the pixel region 111 and the first and second defect detection lines DF-L1 and DF-L2 cross one end portions of the drive power transmission lines TL which are located adjacent to the first common electrode CE1 among both end portions of the drive power transmission lines TL which are located outside the pixel region 111.

The first and second defect detection lines DF-L1 and DF-L2 may be formed such that the first and second defect detection lines DF-L1 and DF-L2 cross the other end portions of the drive power transmission lines TL which are located adjacent to the second common electrode CE2 among both end portions of the drive power transmission lines TL which are located outside the pixel region 111. In this case, the first and second defect detection lines DF-L1 and DF-L2 are connected to a data conductive film DCF in the same manner as the second defect detection line DF-L2 in the second embodiment described above.

The defect detector 101 outputs respective defect detection signals to the first and second defect detection lines DF-L1 and DF-L2 and collects feedback signals that the first and second defect detection lines DF-L1 and DF-L2 generate according to the defect detection signals. The defect detector 101 then determines whether or not there is a defect in the drive power transmission lines TL based on respective comparisons between the defect detection signals and the feedback signals. For example, the defect detector 101 determines that there is no defect in the drive power transmission lines TL upon determining that the defect detection signal applied to the first defect detection line DF-L1 and the feedback signal from the first defect detection line DF-L1 are identical and the defect detection signal applied to the second defect detection line DF-L2 and the feedback signal from the second defect detection line DF-L2 are identical. On the other hand, the defect detector 101 determines that there is a defect in at least one drive power transmission line TL upon determining that at least one of the feedback signal from the first defect detection line DF-L1 and the feedback signal from the second defect detection line DF-L2 is different from the corresponding defect detection signal.

Here, the case in which the defect detection signal and the feedback signal are identical includes not only the case in which the two signals (i.e., the defect detection signal and the feedback signal) are exactly the same ideally but also the case in which the two signals are identical within a preset allowable error range. That is, even when the two signals are not exactly the same, the defect detector 101 may determine that the two signals are identical if the two signals are located within a preset allowable error range. On the other hand, when the two signals are not the same or are not within the allowable error range, the defect detector 101 may determine that the two signals are not identical.

The allowable error range may be set taking into consideration the resistance and capacitance of the first and second defect detection lines DF-L1 and DF-L2.

One end of the first defect detection line DF-L1 is connected to a first output terminal of the defect detector 101 and the other end of the second defect detection line DF-L2 is connected to a first input terminal of the defect detector 101. The defect detection signal is output from the first output terminal of the defect detector 101. For example, a clock signal having a specific period and duty may be used as the defect detection signal.

Here, the one end of the first defect detection line DF-L1 may be connected to the first output terminal of the defect detector 101 through a data conductive film DCF. Specifically, the one end of the first defect detection line DF-L1 may be connected to the first output terminal of the defect detector 101 through a transmission line formed on a data conductive film DCF and another transmission line formed on the printed circuit board PCB. For example, as shown in FIG. 10, the one end of the first defect detection line DF-L1 may be connected to the output terminal of the defect detector 101 through a transmission line 151 formed in a data conductive film DCF that is located leftmost and a transmission line 171 formed in the printed circuit board PCB.

The other end of the first defect detection line DF-L1 may be connected to the first input terminal of the defect detector 101 through a first connecting line CL1 and a data conductive film DCF. Specifically, the other end of the first defect detection line DF-L1 may be connected to the input terminal of the defect detector 101 through a transmission line formed on the first connecting line CL1, the first auxiliary line AL1, and one data conductive film DCF and another transmission line formed on the printed circuit board PCB. For example, as shown in FIG. 10, the other end of the first defect detection line DF-L1 may be connected to the defect detector 101 through a transmission line 151b formed in the first connecting line CL1, the first auxiliary line AL1, and a data conductive film DCF and another transmission line 172 formed in the printed circuit board PCB.

The one end of the second defect detection line DF-L2 may be connected to the second output terminal of the defect detector 101 through a data conductive film DCF. Specifically, the one end of the second defect detection line DF-L2 may be connected to the second output terminal of the defect detector 101 through a transmission line formed on another data conductive film DCF and another transmission line formed on the printed circuit board PCB. For example, as shown in FIG. 10, the one end of the second defect detection line DF-L2 may be connected to the output terminal of the defect detector 101 through a transmission line 152 formed in a data conductive film DCF that is located leftmost and a transmission line 173 formed in the printed circuit board PCB.

The other end of the second defect detection line DF-L2 may be connected to the second input terminal of the defect detector 101 through a second connecting line CL2 and a data conductive film DCF. Specifically, the other end of the second defect detection line DF-L2 may be connected to the second input terminal of the defect detector 101 through a transmission line formed on the second connecting line CL2 and a data conductive film DCF and another transmission line formed on the printed circuit board PCB. For example, as shown in FIG. 10, the other end of the second defect detection line DF-L2 may be connected to the defect detector 101 through a transmission line 152b formed in the second connecting line CL2 and a data conductive film DCF and another transmission line 174 formed in the printed circuit board PCB.

The number of the defect detection lines of the third embodiment may be 3 or more and the defect detection lines are formed on the lower substrate 100 such that the defect detection lines cross different drive power lines.

Fourth Embodiment

Figure 11:
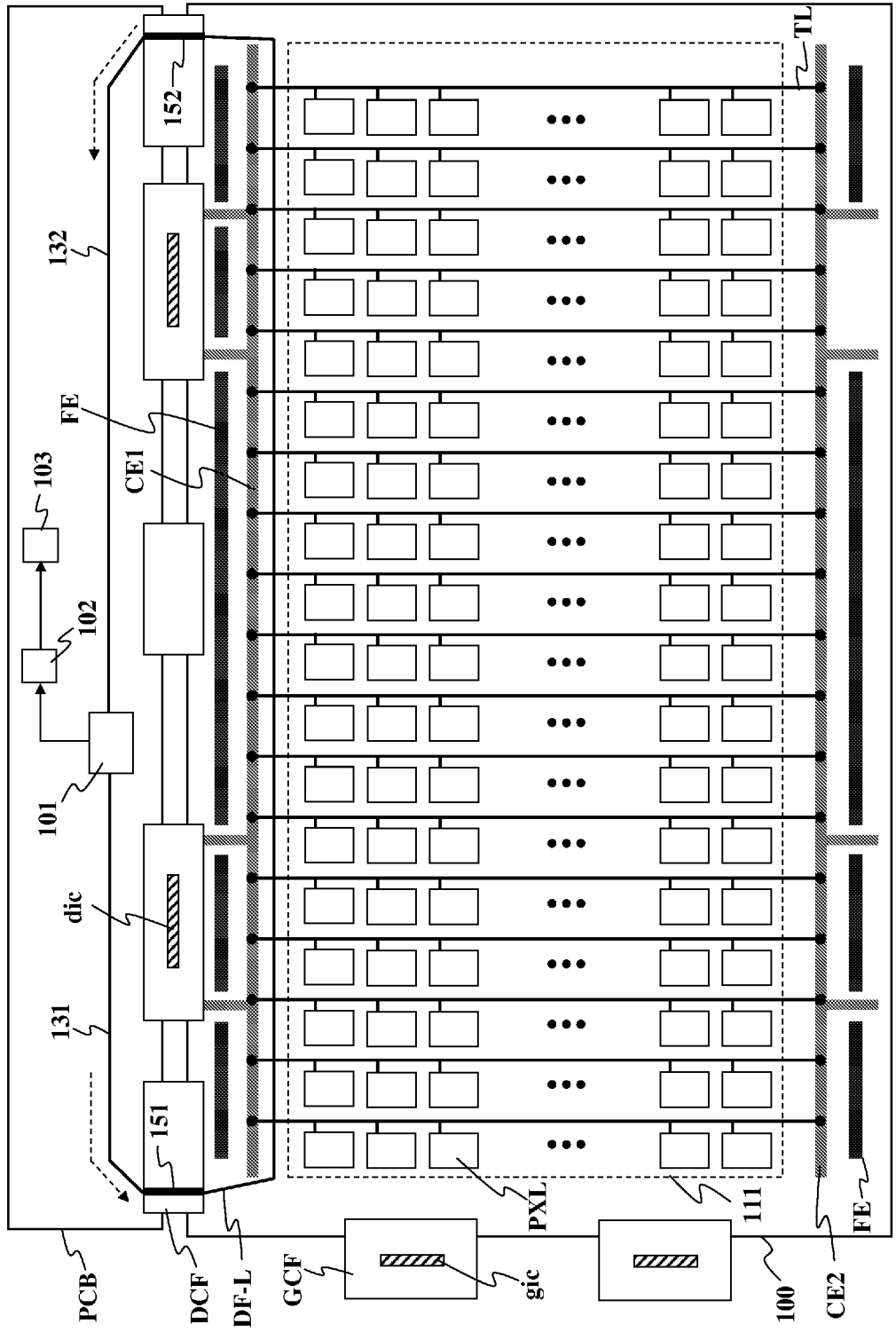
FIG. 11 illustrates a display device according to a fourth embodiment of the present invention.

FIG. 11 illustrates a display device according to a fourth embodiment of the present invention.

The display device according to the fourth embodiment of the present invention is similar to that of the first embodiment. However, the second common electrode CE2 and the counter electrodes FE of the fourth embodiment have different shapes from those of the first embodiment.

That is, the shape of the second common electrode CE2 of the fourth embodiment is similar to that of the first common electrode CE1 of the first embodiment and the shapes of the counter electrodes FE located below the pixel region 111 in the fourth embodiment are similar to the shapes of the counter electrodes FE located above the pixel region 111 in the first embodiment.

Figure 12:
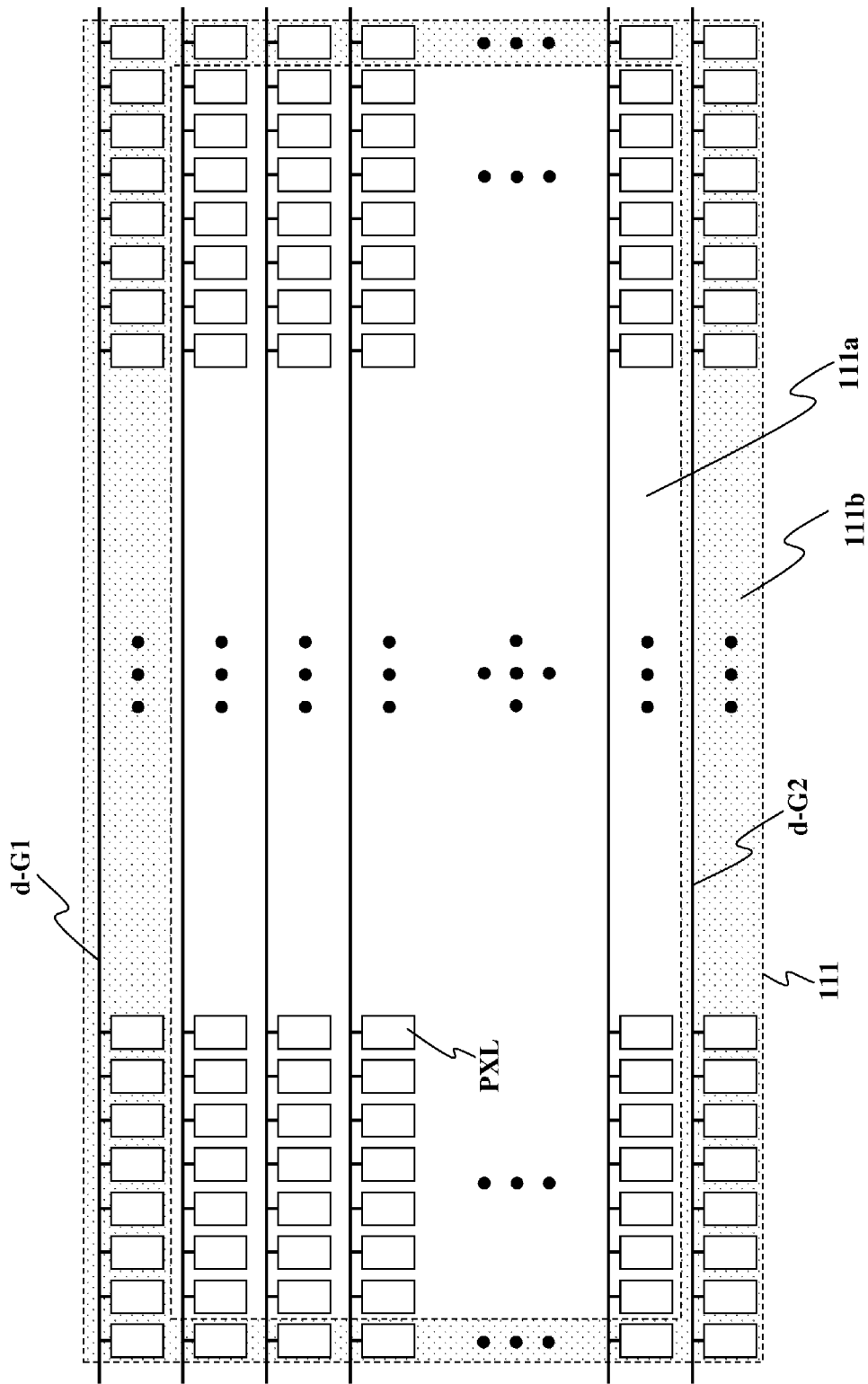
FIG. 12 illustrates an example in which a dummy gate line is used as a defect detection line.

FIG. 12 illustrates an example in which a dummy gate line is used as a defect detection line DF-L.

In the present invention, the pixel region 111 may be divided into a display area and a dummy area as shown in FIG. 12. Pixels PXL of the display area display images on an actual screen and pixels PXL of the dummy area do not display any image on a screen. Due to foreign substance and other causes, pixels PXL located at edges of the pixel region 111 are vulnerable to damage compared to other pixels PXL. That is, the pixels PXL at the edges are dummy pixels. A gate line to which only dummy pixels are connected is a dummy gate line, to which no signal is applied.

In the present invention, a defect detection line DF-L may be formed using such a dummy gate line. For example, two dummy gate lines d-G1 and d-G2 are formed in the dummy area of FIG. 12 and one end of the dummy gate line d-G1 located at the upper side among the two dummy gate lines may be extended and connected to the output terminal of the defect detector 101 through a data conductive film DCF as described above and the end of the dummy gate line d-G1 may be extended and connected to the input terminal of the defect detector 101 through another data conductive film DCF as described above.

As is apparent from the above description, a display device and a method for detecting line defects in the display device according to the present invention have the following advantages.

First, it is possible to easily detect a defect in a drive power transmission line using only a simple structure in which a defect detection line is formed such that the defect detection line crosses drive power transmission lines.

Second, when there is a defect in the drive power transmission lines, drive power cannot be supplied to the first common electrode and the drive power transmission lines and therefore it is possible to prevent damage which is caused to the first common electrode by current concentration into the first common electrode due to a defect in the drive power transmission lines as in the related art.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a plurality of drive power transmission lines for transmitting drive power to pixels;
   at least one defect detection line that crosses at least one drive power transmission line; and
   a defect detector for outputting a defect detection signal to the at least one defect detection line, collecting a feedback signal generated from the defect detection line according to the defect detection signal, and determining whether or not there is a defect in the at least one drive power transmission line based on comparison between the defect detection signal and the feedback signal.

2. The display device according to claim 1, wherein the number of the at least one defect detection line is 1 and the defect detection line crosses all the plurality of drive power transmission lines.

3. The display device according to claim 2, further comprising a common electrode connected to one end of the at least one drive power transmission line,
wherein the defect detection line is located between a pixel region within which the pixels are present and the common electrode.

4. The display device according to claim 2, further comprising at least one conductive film,
wherein the defect detection signal is provided to the defect detection line through the at least one conductive film, and
the feedback signal is provided to the defect detector through the at least one conductive film.

5. The display device according to claim 4, wherein the at least one conductive film includes 2 or more conductive films,
the defect detector outputs the defect detection signal through an output terminal of the defect detector and collects the feedback signal through an input terminal of the defect detector,
one end of the defect detection line is connected to the output terminal of the defect detector through one conductive film, and
the other end of the defect detection line is connected to the input terminal of the defect detector through another conductive film.

6. The display device according to claim 5, wherein the conductive films are arranged along a longitudinal direction of the defect detection line, and
conductive films which are located farthest from each other among the conductive films are the one conductive film and the another conductive film, respectively.

7. The display device according to claim 5, wherein a data integrated circuit for providing a data signal to the pixels is embedded in at least one of the conductive films, and
conductive films in which the data integrated circuit is not embedded are the one conductive film and the another conductive film, respectively.

8. The display device according to claim 5, further comprising:
a first connecting line through which the one end of the defect detection line and the one conductive film are connected to each other; and
a second connecting line through which the other end of the defect detection line and the another conductive film are connected to each other,
wherein the first connecting line and the second connecting line are formed in the same layer and the first connecting line and the defect detection line are formed in different layers.

9. The display device according to claim 1, wherein the number of the at least one defect detection line is 2,
the 2 defect detection lines are a first defect detection line and a second defect detection line,
the first and second defect detection lines cross all the plurality of drive power transmission lines, and
the first and second defect detection lines are located at different parts of the plurality of drive power transmission lines.

10. The display device according to claim 9, further comprising:
a first common electrode connected to one ends of the drive power transmission lines and
a second common electrode connected to the other ends of the drive power transmission lines,
wherein a first defect detection line is located between a pixel region within which the pixels are present and the first common electrode and a second defect detection line is located between the pixel region and the second common electrode.

11. The display device according to claim 9, further comprising at least one conductive film,
wherein the defect detection signal is provided to the first and second defect detection lines through the at least one conductive film,
a feedback signal from the first defect detection line is provided to the defect detector through the at least one conductive film, and
a feedback signal from the second defect detection line is provided to the defect detector through the at least one conductive film.

12. The display device according to claim 11, wherein the at least one conductive film includes 2 or more conductive films,
the defect detector outputs the defect detection signal through first and second output terminals of the defect detector and collects the feedback signal through first and second input terminals of the defect detector,
one end of the first defect detection line is connected to the first output terminal of the defect detector through one conductive film, and
the other end of the first defect detection line is connected to the first input terminal of the defect detector through another conductive film.

13. The display device according to claim 12, further comprising:
a first connecting line and a first auxiliary line through which one end of the second defect detection line and the one conductive film are connected to each other; and
a second connecting line and a second auxiliary line through which the other end of the second defect detection line and the another conductive film are connected to each other,
wherein the one end of the second defect detection line is connected to a second output terminal of the defect detector through the first connecting line, the first auxiliary line, and one conductive film,
the other end of the second defect detection line is connected to a second input terminal of the defect detector through the second connecting line, the second auxiliary line, and another conductive film,
the first defect detection line, the second defect detection line, the first auxiliary line, and the second auxiliary line are formed in the same layer,
the first connecting line and the second connecting line are formed in the same layer, and
the first connecting line and the first defect detection line are formed in different layers.

14. The display device according to claim 12, wherein the conductive films are arranged along a longitudinal direction of the defect detection line, and
conductive films which are located outermost among the conductive films are the one conductive film and the another conductive film, respectively.

15. The display device according to claim 12, wherein a data integrated circuit for providing a data signal to the pixels is embedded in at least one of the conductive films, and conductive films in which the data integrated circuit is not embedded are the one conductive film and the another conductive film, respectively.

16. The display device according to claim 1, wherein the number of the at least one defect detection line is n which is a natural number greater than 1, and the n defect detection lines cross different drive power transmission lines.

17. The display device according to claim 16, further comprising:

a common electrode connected to one ends of the drive power transmission lines, wherein the n defect detection lines are located between a pixel region within which the pixels are present and the common electrode.

18. The display device according to claim 16, further comprising at least one conductive film, wherein a defect detection signal is provided to each of the n defect detection lines through the at least one conductive film, a feedback signal from the n defect detection lines is provided to the defect detector through the at least one conductive film, and a feedback signal from the n defect detection lines is provided to the defect detector through the at least one conductive film.

19. The display device according to claim 18, wherein the at least one conductive film includes 2 or more conductive films, the defect detector outputs the defect detection signal through n output terminals of the defect detector and collects the feedback signal through n input terminals of the defect detector, one ends of the n defect detection lines are connected to the n output terminals of the defect detector through at least one conductive film, and the other ends of the n defect detection lines are connected to the n input terminals of the defect detector through at least one conductive film, a connecting line, and an auxiliary film.

20. The display device according to claim 18, wherein a data integrated circuit for providing a data signal to the pixels is embedded in at least one of the conductive films.

21. The display device according to claim 1, wherein the defect detector determines that there is no defect in the drive power transmission line upon determining that the defect detection signal and the feedback signal are identical and determines that there is a defect in the drive power transmission line upon determining that the defect detection signal and the feedback signal are different.

22. The display device according to claim 1, wherein, when a plurality of feedback signals is present, the defect detector determines that there is no defect in the drive power transmission line upon determining that all the feedback signals are identical to the defect detection signal and determines that there is a defect in the drive power transmission line upon determining that at least one of the feedback signals is different from the defect detection signal.

23. The display device according to claim 1, further comprising:

a drive power unit for generating a drive voltage to be provided to the drive power transmission lines; and a power controller for maintaining or preventing provision of the drive voltage generated by the drive power unit to the drive power transmission lines according to the determination of the defect detector.

24. The display device according to claim 1, wherein a pixel region within which the pixels are present is divided into a display area and a dummy area, and a part of the at least one defect detection line is a dummy gate line connected to dummy pixels in the dummy area.

25. The display device according to claim 1, wherein each of the pixels includes a light emitting diode, and the drive voltage is a voltage for driving the light emitting diode.

26. A method for detecting line defects of a display device including a plurality of drive power transmission lines for transmitting drive power to pixels, the method comprising:

a first process including forming at least one defect detection line such that the at least one defect detection line crosses at least one drive power transmission line; and a second process including outputting a defect detection signal to the at least one defect detection line, collecting a feedback signal generated from the defect detection line according to the defect detection signal, and determining whether or not there is a defect in the at least one drive power transmission line based on comparison between the defect detection signal and the feedback signal.

27. The method according to claim 26, wherein the second process includes:

determining that there is no defect in the drive power transmission line upon determining that the defect detection signal and the feedback signal are identical; and determining that there is a defect in the drive power transmission line upon determining that the defect detection signal and the feedback signal are different.

28. The method according to claim 26, wherein, when a plurality of feedback signals is present, the second process includes:

determining that there is no defect in the drive power transmission line upon determining that all the feedback signals are identical to the defect detection signal; and determining that there is a defect in the drive power transmission line upon determining that at least one of the feedback signals is different from the defect detection signal.

29. The method according to claim 26, further comprising:

a third process including generating a drive voltage to be provided to the drive power transmission lines; and a fourth process including maintaining or preventing provision of the drive voltage generated in the third process to the drive power transmission lines according to the determination of the second process.

30. The method according to claim 26, wherein a pixel region within which the pixels are present is divided into a display area and a dummy area, and a part of the at least one defect detection line is a dummy gate line connected to dummy pixels in the dummy area.

* * * * *